United States Patent [19]

Santini et al.

[11] 4,242,038

[45] Dec. 30, 1980

[54] WAFER ORIENTING APPARATUS

[75] Inventors: Hugo A. E. Santini; David P. Wick, both of San Jose, Calif.

[73] Assignee: International Business Machines Corporation, Armonk, N.Y.

[21] Appl. No.: 53,166

[22] Filed: Jun. 29, 1979

[51] Int. Cl.³ .................. B65G 51/02; B65G 47/24
[52] U.S. Cl. .................. 414/755; 406/87; 414/786
[58] Field of Search .......... 406/10, 19, 84, 87, 406/85; 198/380, 394; 414/755, 786

[56] References Cited

U.S. PATENT DOCUMENTS

| | | | |
|---|---|---|---|
| 3,890,508 | 6/1975 | Sharp | 406/87 X |
| 3,930,684 | 1/1976 | Lasch et al. | 406/87 X |
| 4,024,944 | 5/1977 | Adams et al. | 406/87 X |

*Primary Examiner*—Jeffrey V. Nase
*Attorney, Agent, or Firm*—Henry E. Otto, Jr.

[57] ABSTRACT

An apparatus and method for orienting a substantially flat wafer are described. The wafer preferably has two flat registration edges of unequal length. Upon contact of any edge portion of the wafer with a sensor projecting forwardly from one registration surface, air jets are activated to rapidly rotate the wafer one way until the longer of its two registration edges contacts a sensor projecting forwardly from another registration surface. Then air jets are activated to slowly rotate the wafer the opposite way until said longer registration edge contacts another sensor associated with said other registration surface to effect precise registration of the wafer without overshoot as all three sensor are concurrently contacted and activated. Wafer movement by the jets thereupon terminates and vacuum is applied continuously to hold the wafer in place while the work operation is performed thereon. Since the wafer is registered solely by contact with the various sensor (and not by contact with the respective registration surfaces), contamination of the wafer by physical contact is minimized.

14 Claims, 11 Drawing Figures

WAFER ORIENTING APPARATUS

DESCRIPTION

Technical Field

This invention relates to an apparatus and method for orienting wafers or the like in a desired rotative position at a work station with minimal physical contact and a high degree of precision.

One object of this invention is to provide a wafer orienting apparatus and method in which a wafer with a flat registration edge is registered adjacent a flat registration surface by rotating the wafer one way until a certain condition is sensed, and then rotating the wafer the opposite way to eliminate overshoot and insure precise registration.

Another object is to provide a wafer orienting apparatus and method employing a pair of substantially orthogonally arranged registration surfaces with which are associated, in respective sense ports, strip-like valve elements that are spring biased to normally project a slight distance beyond the respective registration surface to minimize physical contact with and contamination of the wafer during registration.

Background Art

Various apparatus and methods have heretofore been proposed to orient garnet and silicon wafers. U.S. Pat. No. 3,890,508 and 3,930,684 constitute the most pertinent prior art presently known to applicants relating to their wafer orienting apparatus and method.

U.S. Pat. No. 3,890,508 discloses an apparatus for aligning a wafer having one flat registration edge. The apparatus comprises two registration blocks providing orthogonally arranged straight registration surfaces. Vacuum sense ports are disposed adjacent one of the registration surfaces. A pair of photocells are so disposed as to be outboard of the wafer periphery except when the wafer is aligned in a desired position defined by contact with a specific one of the straight registration surfaces. To reduce the possibility of overshoot and speed up wafer alignment, the wafer is rotated at a relatively fast rate until both photocells are uncovered; whereupon rotation rate is reduced.

U.S. Pat. No. 3,930,684 likewise discloses an apparatus for prealigning a wafer in a desired position using a fast, then a slower, rate of rotation in one direction. In this apparatus, if a wafer overshoots the proper prealignment position, pressure fluid pulses are again initiated to again rapidly, and then more slowly, rotate the wafer for another try at the proper prealignment position in which both electro-optical sensors are exposed substantially equal degrees to a light source.

This prior art does not suggest applicants' improved wafer orienting apparatus and method wherein the wafer is rotated intermittently one way at a fast rate until a particular sense means associated with a predetermined one of two registration surfaces is activated; whereupon the wafer is rotated intermittently the opposite way at a slower rate until sense means in both registration surfaces are concurrently activated to terminate motion of the wafer. In applicants' apparatus overshoot is thus prevented. Also, the wafer is registered in a desired position within a tolerance of 0.001" from the registration surfaces but without contacting said surfaces. During registration the wafer contacts one or more of three thin strip-like sensing valve elements, minimizing the possibility of contamination of the wafer.

BRIEF DESCRIPTION OF DRAWINGS

In the accompanying drawings forming a material part of this disclosure.

DISCLOSURE OF INVENTION

A more comprehensive understanding of the invention and of the objects and advantages thereof will be apparent from the following description and accompanying drawings and appended claims.

The apparatus embodying the invention is adapted to orient, in a desired position, a substantially flat work piece, such as a wafer 10 of garnet material. As illustrated in FIGS. 2–6, wafer 10 is generally circular except for two generally flat, orthogonally related registration edges 11, 12 of unequal length.

Figure 1:
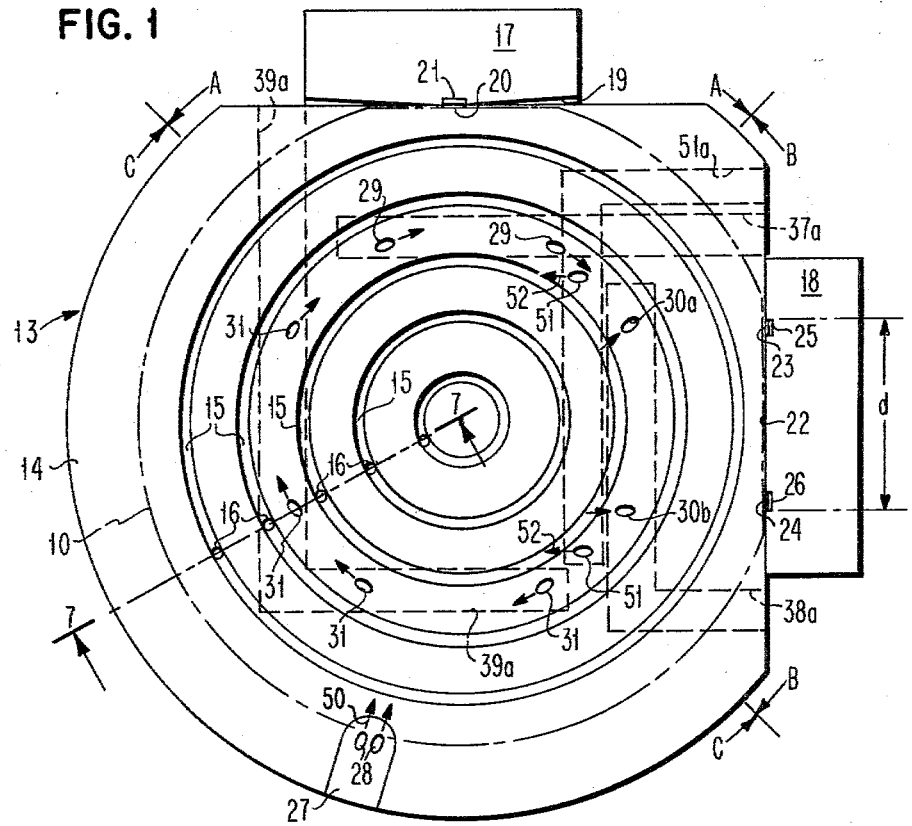
FIG. 1 is a top plan view of a wafer orienting apparatus embodying the invention.

Referring now to FIG. 1, the apparatus embodying the invention comprises a support table 13, preferably of tool steel, having a wafer-supporting surface 14 that is lapped flat except for a series of concentric grooves 15 to which vacuum can be supplied via respective vacuum ports 16. Surface 14 is divided into three zones A, B and C. Associated with table 13 and extending upwardly therefrom are two registration blocks 17, 18.

Block 17, which is disposed adjacent zone A, has a registration surface 19 with a double taper. At the apex of this double taper is a flat, metal strip-like valve element 20 that is inset in a sense port 21 and biased to project slightly (e.g., about 0.001") forwardly of the tapered surface 19.

Figure 9:
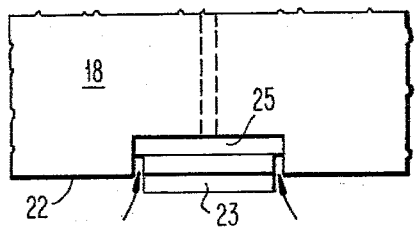
FIGS. 9 and 10 are plan views of part of the apparatus shown in FIG. 8.
Figure 8:
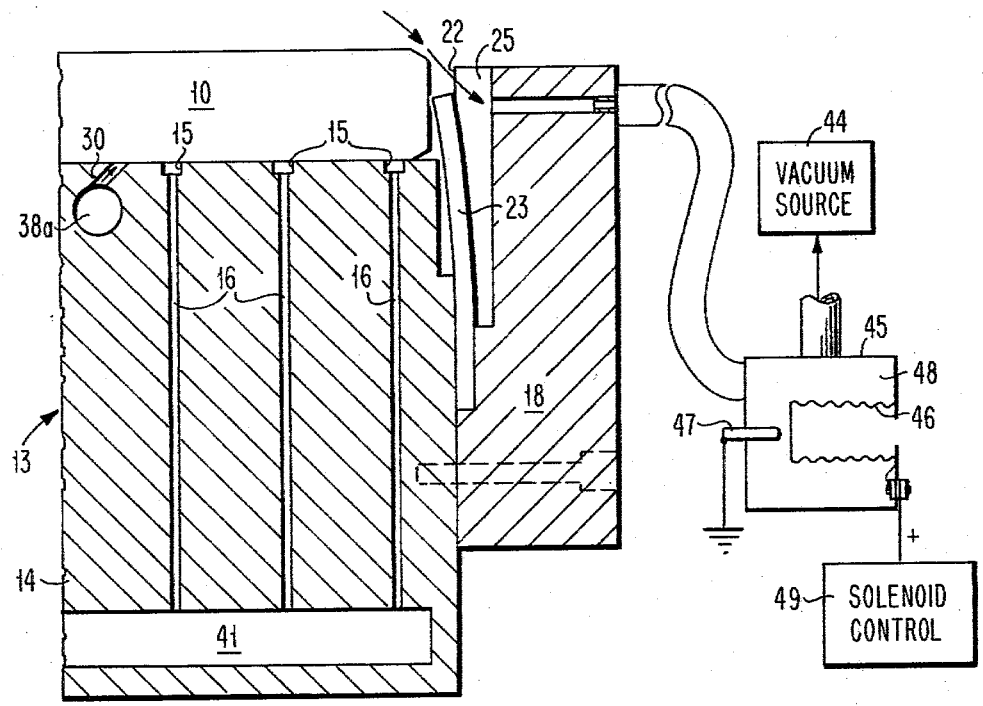
FIG. 8 is a vertical sectional view, to greatly enlarged scale, of a portion of the apparatus shown in FIG. 1.

Block 18 is disposed adjacent zone B. It has a rectilinear non-tapered registration surface 22. Two flat metal strip-like valve elements 23, 24 (identical with valve element 20) are inset in respective sense ports 25, 26 and each biased to project slightly (also about 0.001") forwardly of the straight registration surface 22, as illustrated in FIGS. 8 and 9. The valve elements 20, 23 and 24 constitute movable sense elements that are moved when contacted by the periphery of the wafer 10, to cause sense signals to be generated in the manner hereinafter described.

Figure 7:
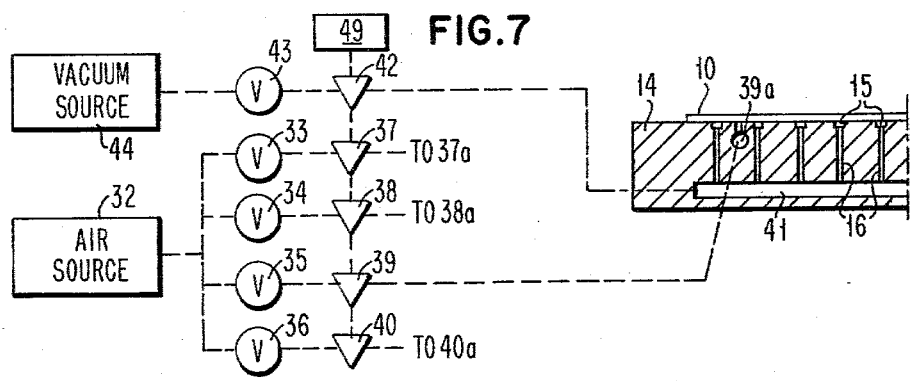
FIG. 7 is a schematic view of a portion of the apparatus, including a fragmentary sectional view, to reduced scale, taken along the line 7—7 in FIG. 1.

Adjacent zone C of the supporting surface 14 is an index block 27 that is provided with a set of directional jet ports 28. Other sets of directional jet ports 29, 30 ad 31 are also provided in zones A and C, respectively. The jet ports 28–31 are activated to direct air at an angle of approximately 30° to the horizontal against the undersurface of water 10. This may be controlled as illustrated in FIG. 7, wherein air under pressure is supplied from a source 32 via a series of regulator valves 33–36 to respective solenoids 37–40. These solenoids are operative in conventional manner to control supply of air (preferably at the frequencies and amplitudes indicated in the timing diagram of FIG. 11).

Thus, solenoids 37 and 39 operate to provide a series of low frequency pulses to ports 29 and 31 in zones A and C to cause the wafer to rotate clockwise at a fast rate. Solenoid 38 operates to provide a series of high frequency pulses to ports 30 in zone B to cause the wafer to rotate counterclockwise at a slow rate. Solenoid 40 operates to provide a continuous stream of air at a predetermined amplitude to ports 28 in index block 27. In each case, air is supplied from the respective solenoid 37–39 via respective manifolds such as 37a, 38a, 39a, (FIG. 1), with 39a being more clearly illustrated in FIG. 7. This figure also shows a vacuum manifold 41 via which vacuum is applied to the vacuum ports 16 and grooves 15 as a series of pulses under control of a solenoid 42 connected via a regulator valve 43 to a vacuum source 44.

Figure 10:
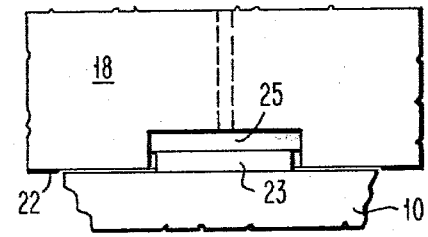

As best illustrated in FIGS. 8–10, each sense means preferably includes, in addition to a strip-like valve element like 23, an electro-pneumatic switch device 45 comprising a bellows 46 and an electrical contact member 47. Before a wafer 10 contacts a valve element like 23, for example, the respective components will be in the positions depicted in FIGS. 8 and 9. Under this condition, valve element 23 will project forwardly of the registration surface 22 approximately 0.001", and thus uncover sense port 25 sufficiently to prevent the absolute pressure in bellows chamber 48 from dropping enough to cause bellows 46 to make contact with member 47. Hence, no electrical signal will be supplied to a solenoid control device 49.

As wafer 10 moves into contact with and deflects a valve element 23, port 25 wil be progressively restricted. As absolute pressure in chamber 48 drops due to the increasingly effective influence of vacuum source 44, air at atmospheric pressure acting on the interior of bellows 46 will cause it to progressively elongate until it makes electrical contact with member 47 and thus causes an electrical signal to be supplied to solenoid control device 49.

It is to be understood that each of the valve elements 20, 23 and 24 operates in the manner just described in connection with valve element 23; and that solenoid control device 49 controls selective and concurrent operation of the respective solenoids 37–40 and 42.

Figure 2:
FIGS. 2–6 are schematic plan views to reduced scale showing sequentially the manner in which the wafer is oriented during operation of the apparatus.

In operation, assume initially that wafer 10 is on support table surface 14 with its long and short registration edges 11, 12 oriented as shown in FIG. 2; and that power is now turned on. Solenoids 37–40 and 42 will now start to operate sequentially and/or concurrently to provide pulses of air or vacuum or a continuous stream of air, as depicted in the timing diagram of FIG. 11.

Figure 3:
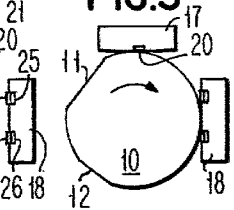
Figure 11:
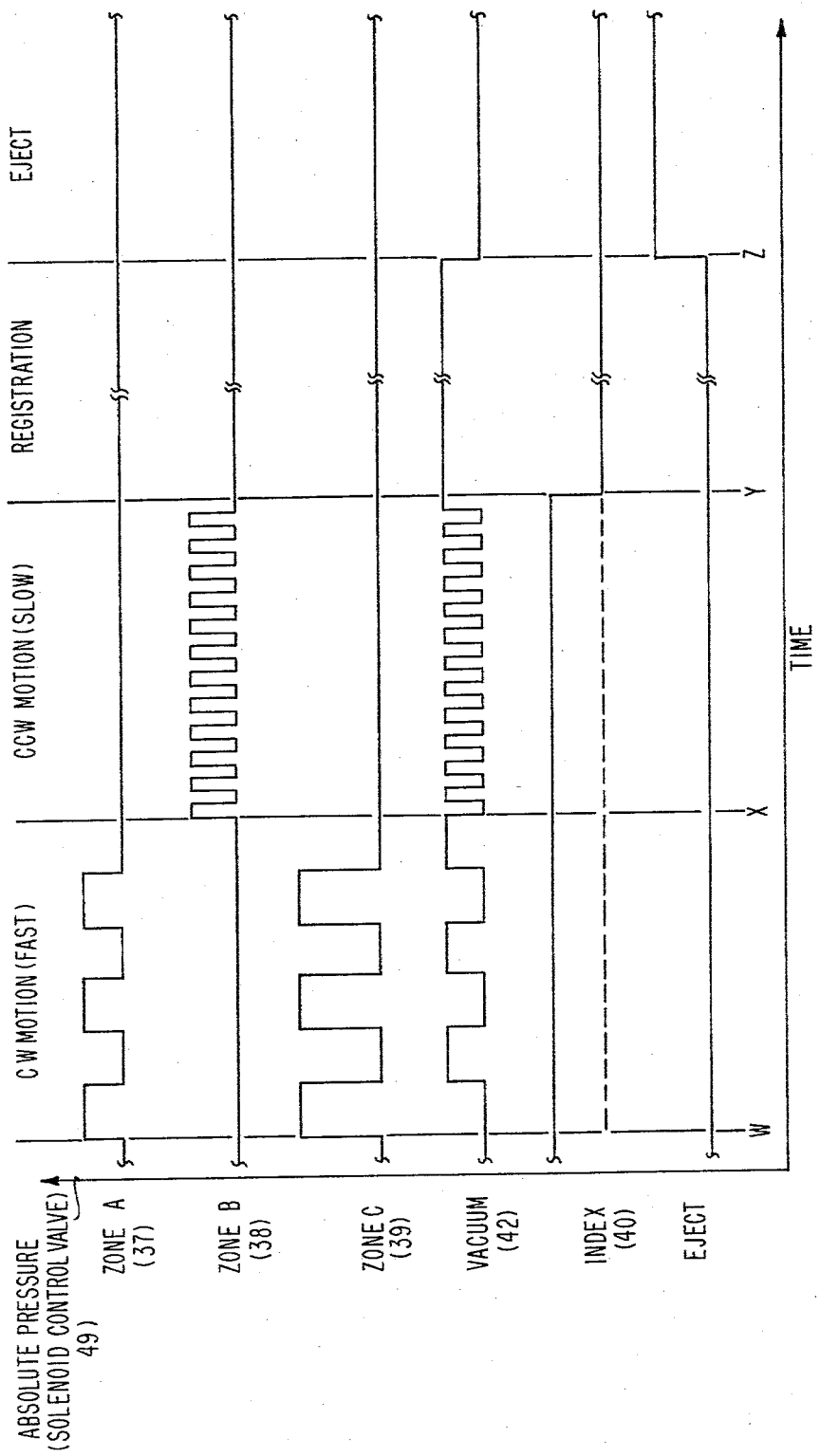
FIG. 11 is a timing diagram showing air pressure and vacuum relationships during successive stages of wafer orientation by the apparatus.

More specifically, and as shown in FIG. 11, a continuous stream of pressurized air supplied via index ports 28 will initially act on the under surface of wafer 10 for driving the wafer generally rectilinearly in the direction of arrows 50 toward registration surfaces 19, 22. When wafer 10 makes initial contact with valve element 20, as illustrated in FIG. 3, solenoid control device 49 will become conditioned as shown at time W (FIG. 11). Pressurized air will thereupon be supplied as pulses via directional jet ports 29 and 31 to rotate wafer 10 clockwise at a relatively fast rate.

According to a feature of the invention, the pressure of air supplied to ports 29 in zone A of surface 14 is, however, less (preferably about one-half) that supplied to ports 31 in zone C to cause the part of wafer 10 nearest the registration surfaces 19, 22 to be tilted downwardly towards support surface 14 to insure that the wafer will not tend to ride upwardly along the registration surfaces, thereby to insure proper operation of the sensing valve elements 20, 23, 24.

Figure 4:
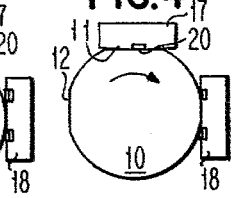
Figures 5, 6:
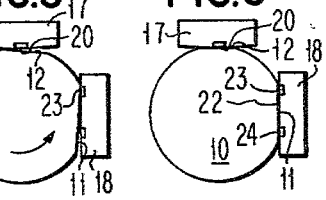

Wafer 10 will continue to rotate clockwise through the position illustrated in FIG. 4 (in which longer wafer edge 11 contacts valve element 20) until said long edge attains the position illustrated in FIG. 5, in which it contacts and activates valve element 23. At this instant (time X, FIG. 11), solenoid control device 49 will be operated to cause solenoid 38 to supply pressure fluid, as a series of short pulses, via jets 30 in zone B to the undersurface of wafer 10 to impart to it a slow counterclockwise motion. Jet 30a will gently keep the long edge 11 against valve element 23 and short edge 12 against valve element 20, while jet 30b will push wafer edge 11 toward valve element 24. When wafer 10 attains the position shown in FIG. 6, and in phantom in FIG. 1, all three valve elements 20, 23, 24 will be activated concurrently. At this instant (time Y, FIG. 11), wafer 10 will be in precise registered position. With all three elements 20, 23, 24 concurrently activated, solenoid control device 49 will cause solenoids 37, 38 and 40 to terminate supply of pressure fluid to jet ports 29, 30 and 31 in zones A, B and C and supply vacuum continuously via manifold 41 to hold the wafer in precise registered position so that a desired work operation may be performed thereon.

After completion of the work operation (at time Z, FIG. 11), pressure fluid is supplied under control of solenoid control device 49 from air source 32 to directional jet ports 51 via a manifold 51a and a solenoid (not shown) to eject the wafer from the work station in a preferred direction, such as that shown by arrows 52.

According to another feature of the invention, ports 28 are so located as to be outside the circumference of wafer 10 when it achieves its final registered position at time Y. This enables the wafer to settle down on surface 14 while the air from ports 28 acts on the edge (rather than the underside) of the wafer to hold the wafer registered.

According to another feature of the invention, valve elements 23 and 24 are separated by a distance d (FIG. 1) which is less than the length of long edge 11 of wafer 10 but greater than the length of short edge 12. This is to insure that valve element 23 will be activated only by the trailing part of long edge 11, and that the curved periphery and short edge 12 will not contact and hence cannot activate valve element 23.

According to still another feature of the invention, surface 19 of registration block 17 has a double taper, as shown in FIG. 1. This is to insure that in the event of non-orthogonality between the long and short edges 11, 12 neither the leading or trailing part of the short edge 12 can cause excessive separation between valve element 20 and the short edge.

According to another important feature of the invention, the location of the sensing valve elements 20, 23, 24 is so selected that the wafer 10 can be accurately realigned, so that subsequent higher level work operations can be superposed upon an earlier work operation with negligible deviation of the wafer from its previous precisely registered position. In practice each edge 11, 12 will not be completely straight or flat, but will have irregularities due to rounding, chamfering, crumbling, or chipping. Therefore, the strip-like valve elements 20, 23, 24 have a width sufficient to span such irregularities to therefore average the irregularities and imperfections in the surface of edges 11, 12. This will insure that the same part of edge 11 always contacts the valve elements 23, 24.

It should be noted that the apparatus herein described in especially suited for use in orienting garnet wafers having two flat, generally orthogonally arranged registration edges of different length. The apparatus will register with the longer of said edges adjacent a specific registration surface irrespective of imperfections in or variations in angularity of the short flat registration edge with respect to the longer edge. The apparatus may be used, however, where the wafer has only one flat registration edge, provided such edge is longer than the dimension d between sensing valve elements 23, 24. This is because valve element 20 is so disposed as to be activated by either the periphery of wafer 10 (whether it be the curved portion between flat registration edges or the registration edges themselves). This results from the fact that valve element 20 is disposed on a radial line from the wafer 10 as registered, whereas valve elements 23, 24 are spaced apart to prevent their being contacted by a curved peripheral surface or even the short flat edge 12.

While the invention has been particularly shown and described with reference to a preferred embodiment thereof, it will be understood by those skilled in the art that various changes in form and detailed may be made therein without departing from the spirit, scope and teaching of the invention. Accordingly, the wafer orienting apparatus and method herein disclosed are to be considered merely as illustrative and the invention is to be limited only as specified in the claims.

Having thus described our invention, what we claim as new and desire to secure by Letters Patent is:

1. Apparatus for orienting a substantially flat wafer or the like having a flat registration edge, said apparatus comprising:
    means providing a flat surface for supporting the wafer and providing a series of directional fluid jet ports,
    means extending upwardly from said flat surface and providing two registration surfaces,
    sense means associated with each of said registration surfaces,
    means for advancing the wafer toward contact with said registration surfaces, and
    means controlled by the conditioning of said sense means for controlling selective supply of fluid to said jet ports, including means for rotating the wafer one way until a particular one of said sense means associated with a predetermined one of said registration surfaces is activated, then rotating the wafer the opposite way until sense means in both registration surfaces are concurrently activated for causing wafer motion to be terminated, thereby to prevent overshoot and insure precision registration of the wafer flat registration edge adjacent said predetermined registration surface without contamination and with minimal physical contact defined solely by contact with said sense means.

2. Apparatus according to claim 1, for orienting a wafer having a second flat registration edge of different length than the first-mentioned registration edge, characterized in that said particular sense means is capable of being activated only by a specific one of the registration edges.

3. Apparatus according to claim 2, wherein the registration surfaces are of unequal length corresponding to substantially similar unequal lengths of the wafer registration edges, and three sense means are provided, one in the shorter registration surface and two, including said particular sense means, spaced apart in the longer registration surface a distance greater than the length of the shorter registration edge of the wafer so that the particular sense means can be activated only by the longer registration edge of the wafer.

4. Apparatus according to claim 1, wherein said advancing means supplies fluid to certain jet ports continually until all sense means are activated for advancing the wafer substantially linearly in a direction toward the point where the registration surfaces would intersect if extended, said fluid initially acting obliquely on the underside of the wafer until the wafer is substantially registered and uncovers said certain ports, for causing the fluid to then act upon the edge of the wafer and insure effective operation of the sense means.

5. Apparatus according to claim 1, wherein the controlled means supplies fluid to said jet ports in such manner that the wafer is rotated at one rate said one way and at a slower rate said opposite way.

6. Apparatus according to claim 1, including means for conveying vacuum to the underside of the wafer, and wherein said controlled means is operative to apply vacuum to said conveying means intermittently until all sense means are concurrently activated, and thereupon continuously to maintain the wafer in precise registration.

7. Apparatus according to claim 1, wherein the jet ports are divided into three groups, the first and second of which are directed and located to cause wafer rotation said one way, but to apply respectively different degrees of lift to the wafer to cause the successive portions of the wafer nearest the registration surfaces during rotating to be tilted downward to prevent the wafer from riding up said surfaces and impairing the effectiveness of said sense means, the third group of jet ports being directed and located to cause wafer rotation said opposite way.

8. Apparatus according to claim 1, wherein each sense means comprises a strip-like valve element associated with a respective sense port and spring-biased to normally project a slight distance beyond the respective registration surface, such that the wafer contacts the valve element rather than full registration surface to minimize physical contact and cause fluid flow through the respective sense port to be progressively restricted for controlling operation of said conditioning controlled means.

9. Apparatus according to claim 8 wherein said slight distance is of the order of about 0.001".

10. Apparatus according to claim 8, wherein each strip-like valve element has a width sufficient to span irregularities in the flat registration edge to average the effect of such irregularities and thereby insure that the respective valve element always contacts the same part of the registration edge.

11. Apparatus according to claim 1, wherein the other of said registration surfaces is non-rectilinear so as to cause the sense means associated with said other surface to project forwardly of said other surface sufficiently to insure that any irregularities in the surface of the wafer as sensed adjacent said other surface will minimally affect re-registration in substantially the same precise position.

12. A method for orienting a wafer or the like in a precise position defined by registration of a substantially flat edge portion of the wafer with one of two registration surfaces associated with a support table, comprising the steps of:
   providing at least one sense means associated with each of said registration surfaces;
   driving the wafer, using one set of air jets, in a substantially rectilinear direction toward contact with said surfaces;
   rotating the wafer one way using another set of air jets until a sense means associated with a specific one of said surfaces is activated by contact of said edge portion therewith;
   then rotating the wafer the opposite way using a different set of air jets until the sense ports associated with both of said surfaces are concurrently activated by said edge portion and another portion of the wafer; and
   then terminating operation of all sets of air jets while applying vacuum to the wafer to hold it in said precise position so that a work operation may be performed thereon.

13. The method according to claim 12, further characterized in that air is supplied continually to at least some of said first set of air jets until the wafer is in said precise position, and air is supplied intermittently in pulses to said other and different jets to effect rapid rotation said one way and slow rotation said opposite way.

14. The method according to claim 12, further characterized in that the wafer has two substantially flat edge portions of different lengths and the sense means are so positioned relative to the registration surfaces that only the longer edge portion can activate and be sensed by the sense means associated with the said specific one of said surfaces.

* * * * *